United States Patent [19]
Chambers, Jr.

[11] 4,363,008
[45] Dec. 7, 1982

[54] ELECTRONIC TRANSFORMER

[75] Inventor: Charles W. Chambers, Jr., Downers Grove, Ill.

[73] Assignee: Tellabs, Inc., Lisle, Ill.

[21] Appl. No.: 216,202

[22] Filed: Dec. 15, 1980

Related U.S. Application Data

[63] Continuation-in-part of Ser. No. 37,446, May 9, 1979, abandoned.

[51] Int. Cl.$^3$ .............................................. H03H 11/02
[52] U.S. Cl. .................... 333/24 R; 307/494; 330/85; 333/213
[58] Field of Search .............................. 333/213–217, 333/24 R, 32; 330/85; 307/260, 264, 494; 328/167

[56] References Cited
U.S. PATENT DOCUMENTS 3,458,719 7/1969 Weiss ............................... 307/296 X
4,057,717 11/1977 Ferry ............................. 333/24 R X

FOREIGN PATENT DOCUMENTS 1913673 9/1970 Fed. Rep. of Germany ...... 333/217

*Primary Examiner*—Paul L. Gensler
*Attorney, Agent, or Firm*—Gary, Juettner & Pyle

[57] ABSTRACT

An electronic transformer is characterized by a pair of out of phase and bilateral current sources, the outputs from which are opposite in phase and control voltages across and currents through respective source and load impedances by combining the voltages in opposition through an amplifier that controls each current source. The electronic transformer has some properties which are essentially the same as those of a conventional magnetic transformer, except that there advantageously is no magnetic field and unwanted magnetic coupling with adjacent components, and the equivalents of leakage reactance, mutual reactance, turns ratio and/or impedance matching may be conveniently and accurately electronically controlled. In addition, the electronic transformer can readily be operated as a switched gain amplifier source, a negative impedance amplifier and/or a positive impedance network generator.

20 Claims, 5 Drawing Figures

ELECTRONIC TRANSFORMER

This is a continuation-in-part application of prior application Ser. No. 37,446, filed May 9, 1979, and now abandoned.

BACKGROUND OF THE INVENTION

The present invention relates to electrical transformers in general, and in particular to an electronic transformer which may be conveniently controlled to exhibit selected properties.

In basic principle, the conventional transformer consists of two coils wound on the same iron core. An alternating current in one winding sets up an alternating magnetic flux in the core, most of which is linked with the other winding and induces in it an alternating emf. Power is thus transferred from one winding to the other via the flux in the core. The winding to which power is supplied is called the primary, that from which power is delivered is called the secondary, and either winding may be used as the primary.

An ideal conventional transformer has no resistances in the windings, and therefore no winding power losses, no core losses such as hysteresis and eddy-current losses, and the coefficient of coupling between the windings is equal to unity. In addition, the permeability of the core is sufficiently high that, theoretically, no emf is necessary to produce the required mutual flux, and the windings have no capacitive effect. Thus, in an ideal transformer the power input to the primary winding equals the power delivered by the secondary winding, or the voltage across one of the windings multiplied by the current therethrough equals the voltage across the other winding multiplied by the current therethrough. As is well known, however, conventional magnetic transformers are far from ideal.

In particular, such transformers exhibit distributed winding capacitances, leakage inductances, core losses and winding capacitance, so that the power delivered by the transformer is less than the power input thereto, and the voltage and current at the output from the transformer are not truly representative of those at the input thereto. For example, in any actual magnetic transformer the flux lines are not confined entirely to the core, but instead some return through the air to their associated windings. Thus, all of the flux generated by the primary winding is not coupled with the secondary winding, so that power losses are incurred. In addition, and irrespective of flux coupling losses, the power output of a conventional transformer is necessarily less than the power input because of unavoidable losses in the form of heat, which consist of resistance heating in the primary and secondary windings and hysteresis and eddy current heating in the core. Hysteresis may be minimized by the use of an iron core having a narrow hysteresis loop, and eddy current by laminating the core, but in spite of these efforts significant losses nevertheless occur.

Because of such disadvantages, it is difficult to design a magnetic transformer to provide, for example, accurately controlled impedance matching and power transmission characteristics, since all of the winding capacitances, winding resistances, leakage inductances and core losses affect the output obtained from a transformer in response to a particular input thereto. Consequently, in the design of such transformers only a best approximation response may be sought and obtained.

OBJECTS OF THE INVENTION

An object of the present invention is to provide an electronic transformer which exhibits the desirable properties of conventional magnetic transformers, but substantially none of their disadvantages.

Another object of the invention is to provide such a transformer which has no inherent winding resistances, core losses or winding capacitance, and in which the coefficient of coupling between the primary and secondary ports is substantially equal to unity.

A further object is to provide such a transformer in which there is no magnetic field, and therefore no magnetic coupling with any adjacent components.

Yet another object is to provide such a transformer in which leakage and mutual reaction may, if desired, be conveniently electronically inserted and controlled.

Still another object is to provide such a transformer in which the turns ratio and impedance matching are conveniently and accurately electronically controlled.

A still further object of the invention is to provide such a transformer which may be operated as a switched gain amplifier source, a negative impedance amplifier and/or a positive impedance network generator.

SUMMARY OF THE INVENTION

In accordance with the present invention, an electronic transformer having a primary port for connection with a source of voltage and a source impedance and a secondary port for connection with a load impedance comprises first and second out of phase and bilateral current sources each for receiving a control signal at an input thereto and for generating at an output therefrom a current flow having a magnitude in accordance with the value of said control signal, said current flows being opposite in phase. Said first current source output is coupled with said primary port and said second current source output is coupled with said secondary port for controlling voltages thereat. Circuit means is coupled with said primary and secondary ports for comparing the voltages thereat, and said circuit means has an output coupled with said inputs to said current sources. Said circuit means generates said control signal at its output, and said control signal has a value in accordance with the difference in values of the primary and secondary port voltages times a constant, whereby said first current source sinks and said second current source sources signals at said primary port, and said second current source sinks and said first current source sources signals at said secondary port.

DETAILED DESCRIPTION

The drawings illustrate embodiments of bilateral electronic transformer circuits in accordance with the teachings of the present invention, along with network equivalents of circuits that may be obtained with or represented by the transformers. The transformers exhibit substantially all of the advantages of conventional magnetic transformers, yet virtually none of the disadvantages thereof. For example, the transformers of the invention do not rely for their operation upon windings which generate magnetic flux, so there is no magnetic coupling between the transformers and any other components in proximity therewith, nor do the transformers have winding capacitances, coil resistance losses, leakage inductances or core losses. In addition, there are no leakage reactances and mutual reactances per se, but instead the equivalents of the same, along with the "turns ratios" and impedance matching capabilities of the transformers, may be accurately and conveniently electronically controlled. Although all of the drawings show single ended circuit configurations, i.e., one side referenced or grounded, it is to be understood that the invention also contemplates balanced symmetrical circuits, and that single ended circuit configurations have been illustrated solely in the interest of facilitating a description of the salient features of the invention.

Figure 1:
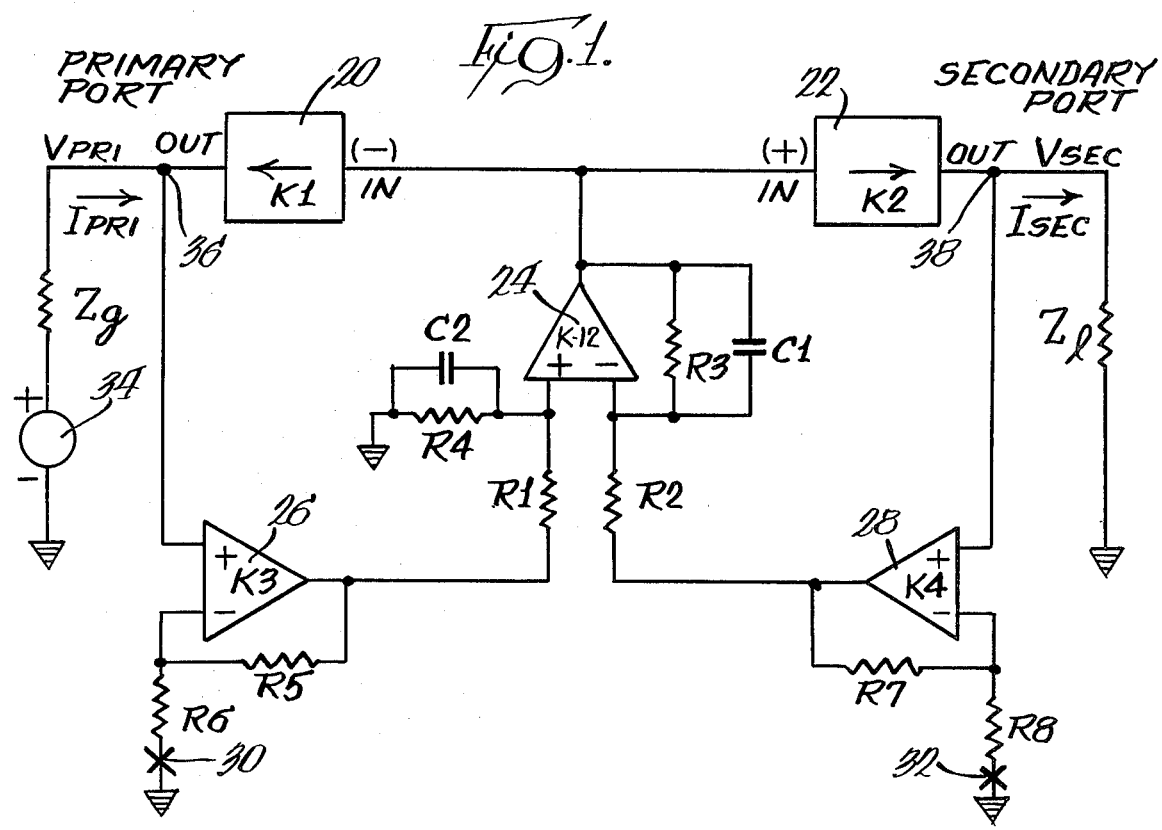
FIG. 1 is a schematic circuit representation of one embodiment of electronic transformer in accordance with the teachings of the present invention.

Referring to FIG. 1, in accordance with one embodiment of the invention an electronic transformer has a conventional and bilateral inverting voltage to current converter or current generator 20 having a transconductance K1, and a conventional and bilateral noninverting voltage to current converter 22 having a transconductance K2, each of which is connected at its input with the output from an operational amplifier (op amp) having a gain K12. Since the current generator 20 is of the inverting type, as indicated by the minus symbol of its input, and the generator 22 is of the noninverting type, as indicated by the plus symbol at its input, the same are out of phase with one another and, in response to the same polarity voltages at their inputs, generate at their outputs current flows which are out of phase with one another or which flow in opposite directions with respect to their outputs, as shown by the arrows for the primary and secondary currents $I_{pri}$ and $I_{sec}$. The output from the converter 20 is connected with a noninverting input to an op amp 26 having a gain K3, and the output from the op amp is applied to a noninverting input to the op amp 24 through a resistor R1. In a similar fashion, the output from the current generator 22 is connected with a noninverting input to an op am 28 having a gain K4, and the output from the op amp is applied to an inverting input to the op amp 24 through a resistor R2. To complete the transformer, a resistance R3 and capacitor C1 are connected in parallel between the inverting input to and the output from the op amp 24, a resistor R4 and a capacitor C2 are connected in parallel between the noninverting input to the op amp and a reference potential or ground, the inverting input to the op amp 26 is connected both with the output therefrom through a resistor R5 and to reference potential through a resistor R6 and switch 30, and the inverting input to the op amp 28 is connected both with the output therefrom through a resistor R7 and to reference potential through a resistor R8 and switch 32. Although not specifically forming a part of the transformer, to facilitate a description of the operation thereof a signal generator comprising a voltage source 34 having an internal impedance $Z_g$ is shown connected between reference potential and a primary port 36 of the transformer at the output from the voltage to current converter 20, and a load impedance $Z_l$ is shown connected between reference potential and a secondary port 38 of the transformer at the output from the voltage to current converter 22.

For the purpose of describing operation of the transformer, assume that a 1:1 input-output relationship is desired. In the case of a conventional magnetic transformer, to have a 1:1 relationship requires equal voltages across and currents through the primary and secondary windings, which would result in a perfect transformer. Obviously, the inherent leakage reactance of, mutual reactance between and resistances of the primary and secondary windings prevents an ideal input-output relationship from being achieved with a conventional transformer. The electronic transformer of the invention, however, very closely approaches in its operation an ideal transformer.

To provide a 1:1 input-output relationship, the transconductance K1 of the inverting voltage to current converter 20 is made equal to the transconductance K2 of the voltage to current converter 22, and the values of the resistors R1 and R2 are made small with respect to the values of the resistors R3 and R3 so that the gain of the op amp 24 is relatively large. In addition, the switches 30 and 32 are opened so that the op amps 26 and 28 operate as voltage followers and reproduce at their outputs voltages equal in value to those at their noninverting inputs. Under this condition, any output from the op amp 24 will cause equal and opposite voltage to current conversions by the out of phase current sources 20 and 22, or current flows at the output from the current sources which are equal in magnitude but opposite in direction with respect to the outputs, so that a primary current $I_{pri}$ of the transformer is equal to a secondary current $I_{sec}$ thereof, which is one of the requirements of an ideal 1:1 transformer.

The output from the op amp 24 is controlled by the values of the voltages at its inputs, which substantially equal the voltages at the outputs from the respective op amps 26 and 28, so that the output or control signal generated by the op amp 24 is equal to the difference in value of the voltages at its input times a constant, or times its gain K12. When an input is first applied to the primary port 36 of the transformer, the output from the op amp 26 increases the voltage at the output from the op amp 24, thereby increasing both the primary and secondary out of phase currents. However, the resulting voltage drop across the load impedance $Z_l$ in response to the secondary current is then applied through the op amp 28 to have inverting input to the op amp 24 to decrease its voltage output and thereby reduce the primary and secondary currents. Since the op amp 24 is operated at a relatively large gain, the differential voltage between its inputs is very slight, and both the primary and secondary voltages are brought to and maintained at substantially equal volumes. Thus, along with the primary and secondary voltages being closely equalized, the primary and secondary currents are of the same magnitude and equal to the voltage of the generator divided by the sum of the generator and load impedances $Z_g$ and $Z_l$, and the electronic transformer operates substantially as an ideal 1:1 transformer.

An obvious advantage of the transformer resides in the fact that it does not rely for its operation upon any generation of magnetic flux. Consequently, the generator 34 may provide either an a.c. or a d.c. voltage since the transformer operates equally well as either an a.c. or a d.c. transformer.

It should be noted that although in its operation the transformer is almost ideal, in use it cannot reach an exactly ideal mode of generation. This may be appreciated if it is considered that in order to have equal magnitude primary and secondary currents, some voltage differential must exist between the inputs to the op amp 24, and therefore between the primary and secondary voltages. By way of example, assume that the load impedance $Z_l$ is short circuited, so that the signal at the inverting input to the op amp 24 is zero. Under this condition, for any primary and secondary currents to be generated some output must be provided by the op amp 24, so that the signal at its noninvertng input cannot be zero. To this end, assume that the transcondutances K1 and K2 of the current generators 20 and 22 are each 0.001, the gain of the op amp 24 is 100, the output from the generator 34 is 1.0 volt and its internal impedance $Z_g$ is 1000 ohms. Thus, to draw a primary short circuit current of 1.0 ma requires an output from the op amp 24 of 1.0 volt, and therefore a signal at its noninverting input of 0.01 volt. The 0.01 volt is the differential or error voltage of the transformer for the particular values assumed. Obviously, increasing the gain of the op amp 24 will reduce the differential voltage.

It is to be appreciated that the gain of the op amp 24 roughly equates to the mutual inductance of a conventional magnetic transformer. However, unlike a magnetic transformer, maximum efficiency of the op amp is obtained at low frequencies since phase shift and instability occur at higher frequencies. To this end, the capacitors C1 and C2 stabilize the op amp at higher, generally out of band frequencies, and since a lower gain and an increased offset voltage occur at higher frequencies, the additional offset or loss roughly equates to the leakage reactance of a conventional magnetic transformer. It is also to be appreciated that the electronic transformer is symmetrical, and that the generator and load impedances may be interchanged without affecting the operation of the transformer, the only difference being in a reversal of the primary and secondary current phases.

The electronic transformer may, of course, be operated in other than a 1:1 input-output relationship. For example, if a step up 1:2 transformer is desired, equilibrium is obtained at a point whereat the secondary voltage equals twice the primary voltage and the primary current equals twice the secondary current. If the transconductance K1 of the current generator 20 equals twice the transconductance K2 of the current generator 22, and if the gain K3 of the op amp 26 equals twice the gain K4 of the op amp 28, this result will be obtained. Under this circumstance, the control signal generated by the op amp 24 will be equal by the difference in values between the primary and secondary port voltages times a constant determined by the gains K3, K4 and K12 of the respective op amps 26, 28 and 24. To conveniently increase the gain of the op amp 26 with respect to that of the op amp 28, the switch 30 may be closed and the switch 32 opened, with any suitable technique being used to control the transconductances K1 and K2 of the voltage to current converters. Obviously, the transconductances and gains can be manipulated in a reverse manner to obtain a step down transformer, and since the various transconductances and gains K1, K2, K3 and K4 may be complex an infinite variety of impedance matching techniques may be obtained with the transformer.

By altering primary and secondary current and voltage relationships in other ways the electronic transformer can provide, for example, gain from one port to the other and simultaneous equal loss from the other port to the one. Thus, if 6 dB of gain from the primary to the secondary side of the transformer is desired, the values of the transformer are controlled so that equilibrium is reached whereat the secondary voltage equals twice the primary voltage and the magnitude of the secondary current is twice that of the primary current. To this end, if the transconductance K2 of the current generator 22 equals twice the transconductance K1 of the current generator 20, and the gain K3 of the op amp 26 equals twice the gain K4 of the op amp 28, the foregoing equilibrium will be obtained and there will be 6 dB of gain in sending from the primary to the secondary port of the transformer. At the same time, if the generator and load are interchanged, then 6 dB of loss will result in sending from the secondary to the primary port.

The relationships between the various transconductances and gains of the transformer components and the manner in which they may be controlled or manipulated to provide various transformer functions may best be expressed in mathematical terms. For example, to obtain a primary to secondary step up transformer function, K3/K4 and K1/K2 are each made greater than unity; to obtain a step down function, K4/K3 and K2/K1 are each set to be greater than unity; a gain from the primary to the secondary transformer port is accomplished by making each of K3/K4 and K2/K1 greater than unity; and a gain from the secondary to the primary transformer port is achieved when each of K4/K3 and K1/K2 are greater than unity.

Accordingly, by controlling the various transconductances and gains of the voltage to current converters and op amps, the operating parameters of and functions performed by the electronic transformer may readily and conveniently be controlled, while at the same time a 1:1 impedance reflection maintained between the primary and secondary ports. In addition, it is worth noting that the transformer can provide various combinations of functions. For example, assume that it is desired to operate the transformer with both a step up of 1:2 and 6 dB of gain from primary to secondary. In this case, the step up requirements are $$K3/K4 = 2 \text{ and}$$

$$K1/K2 = 2,$$

and the requirements for 6 dB of gain are $$K3/K4 = 2 \text{ and}$$

$$K2/K1 = 2.$$

Combining these requirements yields $$K3/K4 = 4 \text{ and}$$

$$K1/K2 = 1,$$

so that if the transconductances of the current generators or current sources are equal and the gain of the op amp 26 is four times as great as that of the op amp 28, a primary to secondary 1:2 step up and 6 dB of gain will be obtained.

As noted, the current source is symmetrical. Thus, it should also be appreciated that signals applied to the primary port are sunk by the current source 20 and sourced by the current source 22, while signals applied to the secondary port are sunk by the current source 22 and sourced by the current source 20. In addition, the magnitudes of the source and sink currents generated by the current sources 20 and 22 are directly related to, and the control or voltage signal at the output from the op amp 24 is always proportional to, the values of the impedances $Z_g$ and $Z_1$ connected with the primary and secondary ports.

Figure 2:
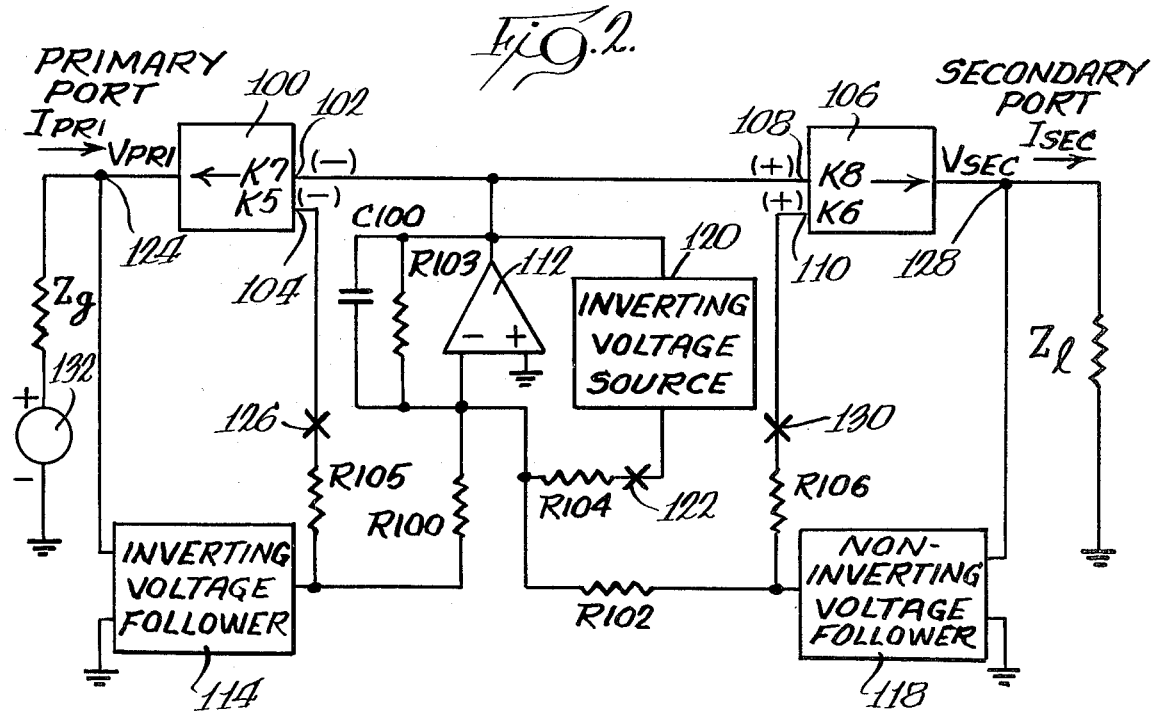
FIG. 2 is a schematic circuit representation of another embodiment of electronic transformer in accordance with the present invention, which may selectively be operated as a negative resistance amplifier.

FIG. 2 illustrates another embodiment of electronic transformer of the invention, which is capable of operation as a negative resistance amplifier. The transformer includes a conventional and bilateral inverting current generator or source 100 having a voltage to current input 102 and a current to current input 104, and a conventional noninverting and bilateral current generator or source 106 having a voltage to current input 108 and a current to current input 110. Obviously, the voltage to current and the current to current portions of the current sources 100 and 106 could be separate, with the outputs from the separate portions being interconnected. An output from an op amp 112 is connected with the voltage to current inputs to the out of phase current sources 100 and 106, and the inverting input thereto is connected both with the output from an inverting voltage follower 114 through a resistor R100 and with the output from a noninverting voltage follower 118 through a resistor R102. The inverting and noninverting voltage followers may be of conventional design, with the inverting voltage follower 114 comprising, for example, a pair of op amps one of which operates are a buffer input to the other, and the noninverting voltage follower 118 a single op amp. A resistor R103 and a capacitor C100 are connected in parallel, and a conventional inverting voltage amplifier or source 120, which may comprise an op amp, is connected in series with a switch 122 and a resistor R104 between the output from and the inverting input to the op amp 112. An input to the inverting voltage follower 114 is connected both with a primary port 124 and with the output from the current source 100, and the output from the inverting voltage follower is also connected through a resistor R105 and a switch 126 to the current to current input 104 of the current generator 100. In a somewhat similar fashion an input to the noninverting voltage follower 118 is connected both with a secondary port 128 and with the output from the current source 106, and the output from the noninverting voltage follower is connected through a resistor R106 and a switch 130 to the current to current input 110 of the current generator 106. Although not forming a specific part of the transformer, a signal generator comprising a voltage source 132 having an internal impedance $Z_g$ is shown connected to the primary port and a load impedance $Z_1$ is connected to the secondary port.

With all of the switches 122, 126 and 130 open the circuit has a mode of operation substantially identical to that of FIG. 1, the primary difference residing in the op amp 112, which corresponds to the op amp 24, being connected as an inverting adder circuit instead of a differential amplifier. However, since the inverting voltage follower 114, which corresponds to the op amp 26, is connected as an inverting instead of noninverting voltage follower, the inverting adder function performed by the op amp 112 is compensated for and the circuit operates in substantially the same manner as the transformer of FIG. 1. Thus, the control signal generated by the op amp 112 is equal to the difference in value between the primary and secondary port voltages times a constant, the current sources 100 and 106 are out of phase and generate at their outputs current flows which are opposite in phase, and signals at the primary port are sunk by the current source 100 and sourced by the current source 106 while signals at the secondary port are sunk by the current source 106 and sourced by the current source 100. In addition, the magnitudes of the primary and secondary port currents are directly related to, and the voltage or control signal at the output from the op amp 112 is always proportional to, the values of the primary and secondary port impedances $Z_g$ and $Z_1$.

Figure 3:
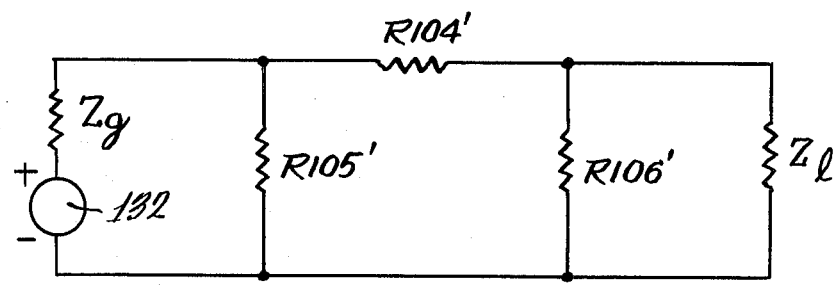
FIG. 3 is a schematic circuit representation of a negative resistance amplifier, and is the electrical network equivalent of the negative resistance amplifier which may be obtained with the transformer of FIG. 2.

With all of the switches 122, 126 and 130 closed, the transformer of FIG. 2 is the electrical equivalent of the circuit network shown in FIG. 3, which is a negative resistance amplifier of a type well known in the art. In particular, the circuit of FIG. 3 includes the negative resistors R104', R105' and R106', which correspond to the respective resistors R104, R105 and R106 of FIG. 2.

In considering operation of the circuit of FIG. 2 as a negative resistance amplifier, it is noted that upon closure of the switches 122, 126 and 130 three additional differences exist between the circuit and that in FIG. 1. The first resides in connection of the output from the inverting voltage follower 114 through the resistor R105 to the current to current input 104 of the current source 100. The second is connection of the output from the noninverting voltage follower 118 through the resistor R106 to the current to current input 110 of the current generator 106, and the third is a positive feedback loop around the op amp 112 provided by the inverting voltage source 120 and resistor R104. With this in mind, to facilitate a description of the circuit in its negative resistance amplifier mode assume that a gain K5 of the current to current converter portion of the current generator 100 is equal to unity, so that with the switch 126 closed a current equal to $-V_{pri}/R105$ at the input 104 converts to a like current at the output, and that a gain K6 of the current to current portion of the current generator 106 is also unity, so that with the switch 130 closed a current of $V_{sec}/R106$ at the input 110 results in a like current at the output and through the load $Z_1$. Thus, the current source 100 provides at its output a current representative of both the output voltage of the op amp 112 as applied to its input 102 and of the current applied to its input 104, and the current generator 106 provides at its output a current representative of both the output voltage of the op amp 112 as applied to its input 108 and of the current applied to its input 110.

Comparing the circuits of FIGS. 2 and 3, the resistors R105 and R106 of FIG. 2 are equal in value (although opposite in sign) to the corresponding negative value resistors in FIG. 3, and the negative resistor R104' of FIG. 3 has a value which is a function of the value of the resistor R104 of FIG. 2. To demonstrate this relationship, further assume that the switches 126 and 130 are open, the switch 122 is closed, the transconductances K7 and K8 of the voltage to current converter portions of the current sources 100 and 106 are each 0.001, the resistors R100 and R102 are each 1000 ohms and the resistor R103 is 100,000 ohms. Under this condition, equilibrium for the op amp 112, whereat the voltages at each of its inputs are substantially of same value and equal to zero, occurs when:

$$-V_{pri}/R100 - V_{amp112}/R104 + V_{sec}/R102 \approx 0$$

First, to show that the value of the resistor R104' is a function of the value of the resistor R104, also assume that the resistor R104' equals −500 ohms, the load impedance $Z_1$ is 1500 ohms, the generator impedance $Z_g$ is 1000 ohms, the voltage of the generator 132 is 2.0 volts and the resistors R105' and R106' are open, which would correspond to the switches 126 and 130 of FIG. 2 being open. Under this condition, and applying Ohms law, the primary and secondary currents each equal 1.0 ma, the primary voltage $V_{pri}$ is 1.0 volt and the secondary voltage $V_{sec}$ equals 1.5 volts. For 1.0 ma in the primary and secondary circuits the output from the op amp 112 in FIG. 2 must be 1.0 volt, and inserting these values into the immediately above formula for equilibrium of the op amp 112 yields a value for R104 of 2000 ohms. Accordingly, for the conditions stated the absolute value of the resistor R104' is 0.25 the value of the resistor R104.

Thus, by the simple addition of the inverting voltage source 120 and resistor R104, a negative series resistance has been added to the transformer. Should a positive series resistance be desired, it is apparent that it would only be necessary that the voltage source 120 be of the noninverting type. In this case, if the value of R104 was 2000 ohms, then instead of 500 ohms negative series resistance being added, 500 ohms positive resistance would occur.

To demonstrate that the resistor R105 directly equates in absolute value to the negative resistor R105', assume that in FIG. 3 the resistor R104' is shorted and the resistor R106' is open (which corresponds to opening the switches 122 and 130 in FIG. 2), the load impedance $Z_1$ is 1000 ohms, the resistor R105' is −1000 ohms and the output from the voltage source 132 is 2.0 volts. Under this condition, 2.0 volts should appear across the load resistor $Z_1$, which is the same as the voltage across the source since the negative resistor R105' and the load impedance $Z_1$ cancel each other and present an infinite impedance or open circuit.

Turning to the circuit of FIG. 2, with the switches 122 and 130 open, the switch 126 closed to insert the resistor R105 and the resistor R105 set to 1000 ohms (the absolute value of the resistor R105'), if the impedance of the load $Z_1$ is 1000 ohms and the voltage provided by the generator is 2.0 volts, then to obtain the same basic conditions as in FIG. 3 no current should flow from the output of the current source 100, 2.0 ma should flow from the output of the current source 106, the primary voltage $V_{pri}$ should equal 2.0 volts and the secondary voltage $V_{sec}$ should equal 2.0 volts. For this equilibrium condition to occur, the voltage from the op amp 112 must be 2.0 volts to obtain 2.0 ma from the current source 106, and the secondary voltage $V_{sec}$ and the voltage across the load impedance $Z_1$ is 2.0 volts. Relative to the current generator 100, an output of 2.0 volts from the op amp 112 causes 2.0 ma of sinking current when fed into the voltage to current input 102. However, since the current at the current to current input 104 equals $-V_{pri}/R105$ or −2.0 ma, the generator also puts out 2.0 ma of sourcing current. The sourcing and sinking currents therefore cancel each other, the net output from the generator 100 is zero and the primary input port 124 appears as an open circuit, which is the case when the resistor R105' and the load impedance $Z_1$ of FIG. 3 cancel each other. It is therefore seen that the resistor R105 of FIG. 2 and the resistor R105' of FIG. 3 have equal absolute values.

In a somewhat similar manner, it may also be shown that the resistor R106 of FIG. 2 equates in absolute value to the resistor R106' of FIG. 3. For the purpose, assume that the load impedance $Z_1$ is again 1000 ohms, the resistor R106' is 1000 ohms, and that the resistor R104' is shorted and the resistor R105' is open, which equates to opening both of the switches 122 and 126 in FIG. 2. Under this condition, the resistor R106' and the load impedance $Z_1$ cancel each other and present an open circuit. Therefore, assuming that the output from the generator 132 is 2.0 volts, there will then be 2.0 volts across the load impedance $Z_1$.

Referring to FIG. 2, and with the switches 122 and 126 open, to obtain the same result the load impedance $Z_1$ and the resistor R106 are each set equal to 1000 ohms, the switch 130 is closed and the voltage of the generator 132 is 2.0 volts. To have an open circuit when looking into the primary port the output from the op amp 112 must be 0 volts, yet 2.0 volts must appear across the load impedance. Therefore, the current generator 106 will source 2.0 milliamps through the resistor R106. For equilibrium, the primary voltage minus the secondary voltage must equal approximately zero, which means that both the primary and secondary voltages must equal 2.0 volts. Since 2.0 volts will occur across the load impedance $Z_1$ when the output from the op amp 112 is 0 volts and the switch 126 is open, it is apparent that an open circuit is obtained when looking into the primary port of the transformer only when the resistors R106 and R106' have equal absolute values.

It should be noted that if the phase of either of the current to current converter portions of the current sources 100 and 106 are reversed, positive instead of negative resistors will be generated within the transformer. It should also be appreciated that the resistors R104, R105 and R106 may be complex, so that either negative and/or positive complex impedances can readily be obtained. In addition, it is apparent that any negative-positive impedance generations, transformer ratios and/or switched gain or loss characteristics are obtainable either separately or in combination.

Figure 4:
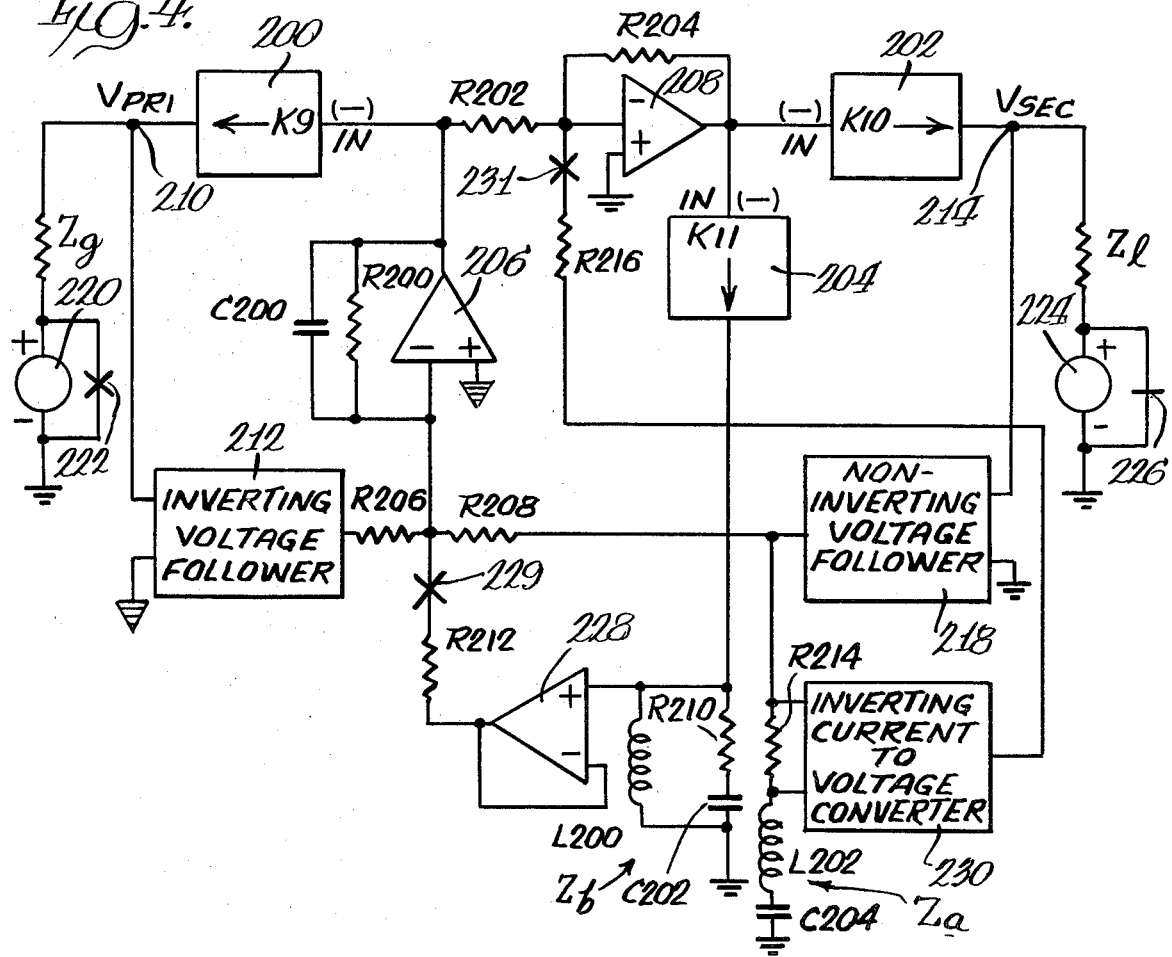
FIG. 4 is a further embodiment of electronic transformer in accordance with the present invention, which may selectively be operated as an impedance network generator to generate a phantom impedance.

FIG. 4 illustrates a further embodiment of the electronic transformer, which may be controlled to generate parallel and/or series complex phantom impedances. The transformer has three inverting voltage to current converters 200, 202 and 204, and an op amp 206 having a noninverting input connected to reference potential and a resistor R200 and capacitor C200 in parallel between its inverting input and output. The output from the op amp is applied both to the input to the current source 200 and through a resistor R202 to an inverting input to an op amp 208, the noninverting input to which is connected to reference potential. A resistor R204 is across the inverting input to and output from the op amp 208, and the output is applied to each of the current sources 202 and 204.

The output from the voltage to current converter 200 at a primary input port 210 to the transformer is connected with an input to a conventional inverting voltage follower 212, the output from which is applied through a resistor R206 to the inverting input to the op amp 206.

In a somewhat similar fashion, the output from the converter 202 at a secondary output port 214 from the transformer is connected with an input to a conventional noninverting voltage follower 218, the output from which is applied through a resistor R208 to the inverting input to the op amp 206. Although not forming a part of the transformer, a voltage source 220 having a switch 222 thereacross and a internal impedance $Z_g$ is shown connected to the primary port, and a voltage source 224 having a switch 226 thereacross is shown connected through a load impedance $Z_l$ to the secondary port.

To the extent described, the transformer of FIG. 4 is somewhat similar to that shown in FIG. 2. However, the transformer differs in the provision of the voltage to current converter 204, an op amp 228 and a conventional inverting current to voltage converter 230 which may comprise, for example, a pair of buffer op amps connected with respective inputs to an output op amp. The output from the current source 204 is applied to a noninverting input to the op amp 228 and across a series connected resistor R210 and capacitor C202 in parallel with a coil L200, and the output from the op amp is connected both with the inverting input thereto and to the juncture between the resistors 206 and 208 through a resistor R212 and a switch 229. The input to the current to voltage converter 230 is derived across a resistor R214 connected in series with an inductor L202 and a capacitor C204 between the output from the voltage follower 218 and reference potential, and the output from the current to voltage converter 230 is applied to the inverting input to the op amp 208 through a resistor R216 and a switch 231.

For the state of the circuit shown in FIG. 4, with the switches 222, 229 and 231 open and the switch 226 closed, it is apparent that the circuit is a 1:1 electronic transformer of the type shown in FIG. 2. The primary differences between the circuits of FIGS. 2 and 4 reside in the inclusion in FIG. 4 of the op amp 208, which is an inverting voltage follower-adder, and in the voltage to current converter 202 being of the inverting type. However, since the output from the op amp 206 is inverted by the op amp 208, and then reinverted by the converter 202, there is essentially no difference electrically between the circuits of FIGS. 2 and 4. Thus, the current sources 200 and 202 operate out of phase and generate their outputs current flows which are opposite in phase, and signals at the primary port are sunk by the current source 200 and and sourced by the current source 202 while signals at the secondary port are sunk by the current source 202 and sourced by the current source 200.

Figure 5:
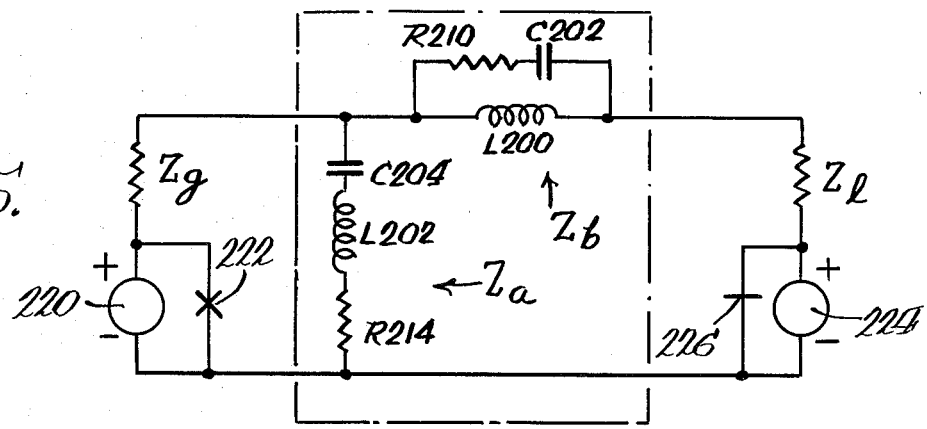
FIG. 5 is the electrical equivalent of the impedance which may be obtained with the circuit of FIG. 4.

FIG. 5 illustrates a circuit network which is the electronic equivalent of that which may be obtained with the circuit of FIG. 4 when the switches 229 and 231 are closed, and in which like designations have been used for circuit components common to both FIGS. 4 and 5. As is seen, the network of FIG. 5 consists of a complex parallel impedance comprising the series connected capacitor C204, inductor L202 and resistor R214, and a complex series impedance comprising the series connected capacitor C202 and resistor R210 connected in parallel with the inductor L200.

For the purpose of demonstrating that the network shown in FIG. 5 is the equivalent of that which may be generated with the transformer of FIG. 4, assume that the transconductances K9, K10 and K11 of the respective voltage to current converters 200, 202 and 204 are each 0.001, that the current to voltage converter 230 converts 1.0 ma through the resistor R214 to 1.0 volt at its output, that the resistors R206, R208 and R212 are each 1000 ohms, the resistor R200 is 100,000 ohms and each of R202, R204 and R216 is 10,000 ohms.

Referring to both FIGS. 4 and 5, for the conditions specified and with the switches 222, 229 and 231 open and the switch 226 closed, if a signal is transmitted from the primary to the secondary port the reflected impedance will be the load impedance $Z_l$. If the switch 231 is closed, the reflected impedance should then comprise the series connected resistor R214, inductor L202 and capacitor C204, designated collectively at $Z_a$, in parallel with the load impedance, which will be the case if the load impedance is deprived of the current that would flow through the impedance $Z_a$. To this end, the voltage across the load impedance $Z_l$ will be $V_{sec}$, which is applied through the voltage follower 218 across the impedance $Z_a$. The current to voltage converter 230 then generates at its output a voltage in accordance with the magnitude of the current through the resistor R214, which voltage is summed with the voltage at the output from the op amp 206 at the inverting input to the op amp 208 by means of the resistors R202 and R216. Thus, the current at the output from the voltage to current converter 202 will be equal to $$(V_{op\ amp\ 206} - V_{sec} \times 1000/Z_a) \times 0.001,$$

the current at the output from the voltage to current converter 200 will equal $$-V_{op\ amp\ 206} \times 0.001,$$

and the relationship between the primary and secondary voltages will be $$-V_{pri} + V_{sec} \approx 0$$

Accordingly, since the current $V_{sec}/Z_a$ is subtracted from the current at the output from the voltage to current converter 202, that current will not flow through the load impedance $Z_l$ and the reflected impedance will be $$Z_l Z_a / (Z_l + Z_a),$$

which is $Z_a$ in parallel with the load impedance $Z_l$.

Consider now the situation where the switches 222 and 231 are open and the switches 226 and 229 are closed. Opening the switch 231 opens the circuit through the impedance $Z_a$ and closing the switch 229 places the impedance comprising the inductor L200 in parallel with the series connected resistor R210 and capacitor C202, designated collectively at $Z_b$, into the circuit, so that the reflected impedance should be $Z_b$ plus the load impedance $Z_l$. This is accomplished by the voltage to current converter 204, the current output from which is the same as that at the output from the converter 202 flowing through the load impedance $Z_l$. The output from the converter 204 is applied across the impedance $Z_b$ (FIG. 4), which causes the op amp 228 to generate at its output a voltage having a value in accordance with the value of $Z_b$ and the current supplied by the source 204, and equal to the voltage across $Z_b$.

For equilibrium of the circuit to occur, the voltage at the inverting input to the op amp 206 must be approximately 0 volts, so that $-V_{pri} + V_{sec} + V_{op\ amp\ 228} \approx 0.$ Thus, in operation of the circuit the voltage at the output from the op amp 228 is added to the secondary voltage from the voltage follower 218, which is the same as adding the voltage drop across $Z_b$ to the secondary voltage, and the sum of the two voltages approximately equals the primary voltage. It is seen, therefore, that with the switch 229 closed and the switch 231 open, the reflected impedance generated by the transformer circuit of FIG. 4 is equal to $Z_b$ in series with the load impedance $Z_l$. It is understood, of course, that the greater the magnitude of the negative primary voltage $-V_{pri}$, the lower the current sourced by the voltage to current converter 200, and the higher the reflected impedance. If both of the switches 229 and 231 are closed, the reflected impedance will be $Z_a$ in parallel with the series connected impedances $Z_b$ and load impedance $Z_l$.

Note that the transformer of FIG. 4 is bidirectional, and is equally capable of generating reflected impedances in either direction. Thus, the switches 222 and 226 provide selective control over the direction of operation of the transformer, so that either the port 210 or the port 214 may be used as the input to the transformer.

The invention thus provides electronic transformers which are controllable to operate as transformers, switched gain amplifier sources, negative impedance amplifiers and/or as positive impedance network generators. The transformers provide the advantages of conventional magnetic transformers, and yet improve upon the same by the absence of a magnetic field and unwanted magnetic coupling with adjacent components. Further, the transformers may be conveniently and accurately electronically controlled to provide the equivalents of leakage reactance, mutual reactance, turns ratio and/or impedance matching.

It is appreciated that in use of the transformer, the values of the various parameters determine its particular operating characteristics. For example, for the embodiment of transformer in FIG. 1 the magnitude of the offset voltage, or the difference in value between the primary and secondary port voltages, is inversely proportional to the value of the load impedance $Z_l$, since for decreasing load impedance values the secondary port voltage decreases and the offset values increases for given current flows generated by the current sources 20 and 22. Similarly, the offset voltage is inversely proportional to the value of the source impedance $Z_g$, since for decreasing values of the source impedance the increased current flow increases the voltage across the load impedance and at the secondary port and therefore increases the offset voltage. Of course, the offset voltage may be reduced by increasing the gain K12 of the op am 24 and/or the gains K3 and K4 of the op amps 26 and 28, or it may be increased by reducing the gain K12 and/or the gains K3 and K4. Thus, for given gains K1 and K2 of the current sources 20 and 22, the difference in value between the primary and secondary port voltages is determined by the value of the source impedance $Z_g$, the value of the load impedance $Z_l$, the gain K12 of the op amp 24 and/or the gains K3 and K4 of the op amps 26 and 28. It is understood, of course, that a similar relationship of parameters to operating characteristics applies to the embodiments of transformers in FIGS. 2 and 4.

While embodiments of the invention have been described in detail, it is understood that various modifications and other embodiments thereof may be devised by one skilled in the art without departing from the spirit and the scope of the invention, as defined by the appended claims.

What is claimed is:

1. A bilateral electronic transformer having a primary port for connection with a signal generator having an impedance and a secondary port for connection with a load impedance, comprising first and second out of phase sinking and sourcing current sources, each for receiving a control signal at an input thereto and for generating at an output therefrom a current flow having a magnitude in accordance with the value of said control signal, said current flows being opposite in phase and said first current source output being coupled with said primary port and said second current source output being coupled with said secondary port; and circuit means coupled with said primary and secondary ports for comparing the voltages thereat, said circuit means having an output coupled with said current source inputs and generating said control signal at said output, said control signal having a value in accordance with the difference in values of the primary and secondary port voltages times a constant, wherein the difference in value between the primary and secondary port voltages is inversely proportional to the value of the load impedance times the same constant, whereby signals at said primary port are sunk by said first current source and sourced by said second current source and signals at said secondary port are sunk by said second current source and sourced by said first current source, wherein said control signal is a voltage signal, said first and second current sources are first second out of phase voltage to current converters, one of said voltage to current converters is an inverting voltage to current converter and the other is a noninverting voltage to current converter, and said circuit means includes an operational amplifier (op amp) having an output coupled with said voltage to current converter inputs, an inverting input coupled with one of said primary and secondary ports and a noninverting input coupled with the other of said ports, and including a first voltage amplifier circuit connected at an input thereto with said primary port and at an output therefrom with one of said op amp inputs, and a second voltage amplifier circuit connected at an input thereto with said secondary port and at an output therefrom with the other op amp input, said constant having a value determined by the gains of said op amp and said first and second voltage amplifier circuits.

2. A bilateral electronic transformer having a primary port for connection with a signal generator having an impedance and a secondary port for connection with a load impedance, comprising first and second out of phase sinking and sourcing current sources each for receiving a control signal at an input thereto and for generating at an output therefrom a current flow having a magnitude in accordance with the value of said control signal, said current flows being opposite in phase and said first current source output being coupled with said primary port and said second current source output being coupled with said secondary port for controlling voltages thereat; and circuit means coupled with said primary and secondary ports for comparing voltages thereat, said circuit means having an output coupled with said inputs to said current sources and generating said control signal at said output, said control signal having a value in accordance with the difference in values of the primary and secondary port voltages times a constant, wherein the difference in value between the primary and secondary port voltages is inversely proportional to the value of the load impedance times the same constant, said circuit means including differential amplifier means having an output coupled with said current source inputs and a pair of inputs, means for applying a reference potential to one of said differential amplifier means inputs, and summing circuit means coupled with said other differential amplifier means input and with said primary and secondary ports for applying to said other input a voltage representative of the difference in the values of the voltages at said primary and secondary ports, whereby signals at said primary port are sunk by said first current source and sourced by said second current source and signals at said secondary port are sunk by said second current source and sourced by said first current source.

3. A bilateral transformer as in claim 2, said summing circuit means including inverting voltage amplifier means connected at an input thereto with one of said primary and secondary ports, noninverting voltage amplifier means connected at an input thereto with the other of said ports, and first and second impedance means connected in series between outputs of said voltage amplifier means and at a juncture therebetween with said other input to said differential amplifier means.

4. A bilateral electronic transformer having a primary port for connection with a signal generator having an impedance and a secondary port for connection with a load impedance, comprising first and second out of phase sinking and sourcing current sources, each for receiving a control signal at an input thereto and for generating at an output therefrom a current flow having a magnitude in accordance with the value of said control signal, said current flows being opposite in phase and said first current source output being coupled with said primary port and said second current source output being coupled with said secondary port for controlling voltages thereat; and circuit means coupled with said primary and secondary ports for comparing the voltages thereat, said circuit means having an output coupled with said inputs to said current sources and generating said control signal at said output, said control signal having a value in accordance with the difference in values of the primary and secondary port voltages times a constant, wherein the difference in values between the primary and secondary port voltages is inversely proportional to the value of the load impedance times the same constant and said first current source is an inverting voltage to current source having a transconductance K1, said second current source is a noninverting voltage to current source having a transconductance K2, and said circuit means is coupled with said primary port through a first voltage amplifier having a gain K3 and with said secondary port through a second voltage amplifier having a gain K4.

5. A bilateral transformer as in claim 4, wherein K1/K2 and K3/K4 each equal unity, so that said transformer has a 1:1 relationship between said primary and secondary ports.

6. A bilateral transformer as in claim 4, wherein K1/K2 and K3/K4 are each greater than unity, so that said transformer has a step up relationship from said primary to said secondary port and a step down relationship from said secondary to said primary port.

7. A bilateral transformer as in claim 4, wherein K2/K1 and K4/K3 are each greater than unity, so that said transformer has a step down relationship from said primary to said secondary port and a step up relationship from said secondary to said primary port.

8. A bilateral transformer as in claim 4, wherein K2/K1 and K3/K4 are each greater than unity, so that said transformer has a gain increase from said primary to said secondary port and a gain decrease from said secondary to said primary port.

9. A bilateral transformer as in claim 4, wherein K1/K2 and K4/K3 are each greater than unity, so that said transformer has a gain decrease from said primary to said secondary port and a gain increase from said secondary to said primary port.

10. A bilateral electronic transformer having first and second ports, comprising an inverting voltage to current converter having an output coupled with said first port for controlling a voltage thereat; a noninverting voltage to current converter having an output coupled with said second port for controlling a voltage thereat, said voltage to current converters being out of phase sinking and sourcing voltage to current converters and each having an input for receiving a control voltage signal and generating at its output a current flow having a magnitude in accordance with the value of said control signal, said current flows being opposite in phase; and means for generating said control signal, said means including amplifier means for generating at an output therefrom said control signal, said output being coupled with said voltage to current converter inputs, and means coupling at least one input to said amplifier means with voltages at said first and second ports so that said control signal has a value in accordance with the difference in values between the voltages at said first and second ports times a constant, said means coupling said at least one amplifier means input to the voltages at said first and second ports comprising an inverting voltage amplifier connected at an input thereto with said first port and having an output, a noninverting voltage amplifier connected at an input thereto with said second port and having an output, and first and second impedance means connected in series between said outputs from said voltage amplifiers and at a juncture therebetween with said at least one amplifier means input, whereby signals at said first port are sunk by said inverting voltage to current converter and sourced by said noninverting voltage to current converter and signals at said second port are sunk by said noninverting voltage to current converter and sourced by said inverting voltage to current converter.

11. A bilateral transformer as in claim 10, further including an inverting current to current converter having an output coupled with said first port and having an input; and third impedance means connected between said inverting current to current converter input and said inverting voltage amplifier output, so that with a load impedance connected with said second port the impedance reflected to said first port comprises an impedance having a value which is a function of the value of the load impedance in parallel with a negative impedance having a value which is a function of the value of said third impedance.

12. A bilateral transformer as in claim 10, further including a noninverting current to current converter having an output coupled with said second port and having an input; and third impedance means connected between said noninverting current to current converter input and said noninverting voltage amplifier output, so that with a load impedance connected with said second port the impedance reflected to said first port comprises an impedance having a value which is a function of the load impedance in parallel with a negative impedance having a value which is a function of said third impedance.

13. A bilateral transformer as in claim 10, further including a second inverting voltage amplifier connected at an input thereto with the output from said amplifier means and having an output, and third impedance means connected between said second inverting voltage amplifier output and said at least one input to said amplifier means, so that with a load impedance connected with said second port the impedance reflected to said first port comprises an impedance having a value which is a function of the load impedance in series with a negative impedance having a value which is a function of said third impedance.

14. A bilateral transformer as in claim 10, further including third impedance means connected between said output from said at least one input to said amplifier means, so that with a load impedance connected to said second port the impedance reflected to said first port comprises an impedance having a value which is a function of the load impedance in series with an impedance having a value which is a function of said third impedance.

15. An electronic transformer having first and second ports, comprising a first inverting voltage to current converter having an output coupled with said first port for controlling a voltage thereat; a second inverting voltage to current converter having an output coupled with said second port for controlling a voltage thereat, each said inverting voltage to current converter having an input for receiving a voltage and generating at its output a current flow having a magnitude in accordance with said voltage; a first inverting voltage amplifier connected at an output therefrom with said input to said second inverting voltage to current converter and having an input; amplifier means for generating a control voltage signal at an output therefrom, said output being coupled with the inputs of each of said first voltage to current converter and said first inverting voltage amplifier; and means for coupling at least one input to said amplifier means with the voltages at said first and second ports so that said control voltage, and therefore the current flows from said voltage to current converters, have values in accordance with the difference in value of the voltages at said first and second ports.

16. A transformer as in claim 15, said coupling means comprising a second inverting voltage amplifier connected at an input thereto with said first port and having an output, a first noninverting voltage amplifier connected at an input thereto with said second port and having an output, said first and second impedance means connected in series between said outputs from said second inverting and said first noninverting voltage amplifiers and at a juncture therebetween with said at least one amplifier means input.

17. A transformer as in claim 16, further including third impedance means; a third inverting voltage to current converter having an input connected with the output from said first inverting voltage amplifier and an output connected with said third impedance means for providing a current flow therethrough to generate a voltage thereacross, a second noninverting voltage amplifier for receiving at an input thereto the voltage across said third impedance means and having an output; and fourth impedance means connected between said second noninverting voltage amplifier output and said at least one input to said amplifier means, so that with a load impedance connected to said second port the impedance reflected to said first port comprises an impedance having a value which is a function of the load impedance in series with an impedance having a value which is a function of said third impedance.

18. A transformer as in claim 16, further including third impedance means connected with the output from said first noninverting voltage amplifier for having a voltage impressed thereacross; a current to voltage converter connected at an input thereto with at least a portion of the voltage across said third impedance means and having an output; fourth impedance means connected between said output from said current to voltage converter and said input to said first inverting voltage amplifier; and fifth impedance means connected between said output from said amplifier means and said input to said first inverting voltage amplifier, so that with a load impedance connected to said secondary port the impedance reflected to said first port comprises an impedance having a value which is a function of the load impedance in parallel with an impedance having a value which is a function of said third impedance.

19. An electronic transformer having first and second ports, comprising an inverting current source having an output coupled with said first port, a noninverting current source having an output coupled with said second port, each said current sources being out of phase and having an input for receiving a control signal and generating at its output a current flow having a magnitude determined solely by the value of said control signal, said current flows being opposite in phase; and amplifier means coupled with voltages at said first and second ports, said amplifier means having an output coupled with said current source inputs and generating said control signal at said output, said control signal having a value in accordance with the difference in values between the voltages at said first and second ports times a constant, whereby signals at said first port are sunk by said inverting current source and sourced by said noninverting current source and signals at said second port are sunk by said noninverting current source and sourced by said inverting current source.

20. An electronic transformer having first and second ports, comprising an inverting voltage to current converter having an output coupled with said first port for controlling a voltage thereat; a noninverting voltage to current converter having an output coupled with said second port for controlling a voltage thereat, said voltage to current converters being out of phase and each having an input for receiving a control voltage signal and for generating at its output a current flow having a magnitude determined solely by the value of said control signal, said current flows being opposite in phase; and means for generating said control signal, said means including amplifier means for generating at an output therefrom said control signal, said output being coupled with said voltage to current converter inputs, and means coupling at least one input to said amplifier means with the voltages at said first and second ports so that said control signal has a value in accordance with the difference in values between the voltages at said first and second ports times a constant, whereby signals at said first port are sunk by said inverting voltage to current converter and sourced by said noninverting voltage to current converter and signals at said second port are sunk by said noninverting voltage to current converter and sourced by said inverting voltage to current converter.

* * * * *